United States Patent [19]
Brilka et al.

[11] Patent Number: 5,434,543
[45] Date of Patent: Jul. 18, 1995

[54] OSCILLATOR WITH SWITCHABLE VARACTOR DIODES

[75] Inventors: Joachim Brilka; Wolfgang Weltersbach, both of Hamburg, Germany

[73] Assignee: U.S. Philips Corporation, New York, N.Y.

[21] Appl. No.: 236,934

[22] Filed: May 2, 1994

[30] Foreign Application Priority Data

May 3, 1993 [DE] Germany .................. 43 14 424.1

[51] Int. Cl.[6] .............................................. H03B 5/12
[52] U.S. Cl. ............................ 331/117 R; 331/177 V; 331/179
[58] Field of Search .............. 331/117 R, 117 FE, 167, 331/168, 177 V, 179

[56] References Cited

U.S. PATENT DOCUMENTS

| | | | |
|---|---|---|---|
| 3,538,450 | 11/1970 | Andrea et al. | 331/179 X |
| 3,668,553 | 6/1972 | Dunn et al. | 331/179 X |
| 4,593,256 | 6/1986 | Bickley | 331/179 X |

*Primary Examiner*—Siegfried H. Grimm
*Attorney, Agent, or Firm*—Edward W. Goodman

[57] ABSTRACT

Oscillator having first frequency-determining elements provided for a first oscillation frequency. In order to provide an oscillator, particularly for use in video signal processing, which can be switched and tuned to at least two oscillation frequencies, at least a second frequency-determining element is provided which can be connected to the first frequency-determining element for adjusting the oscillator to a second oscillation frequency.

10 Claims, 1 Drawing Sheet

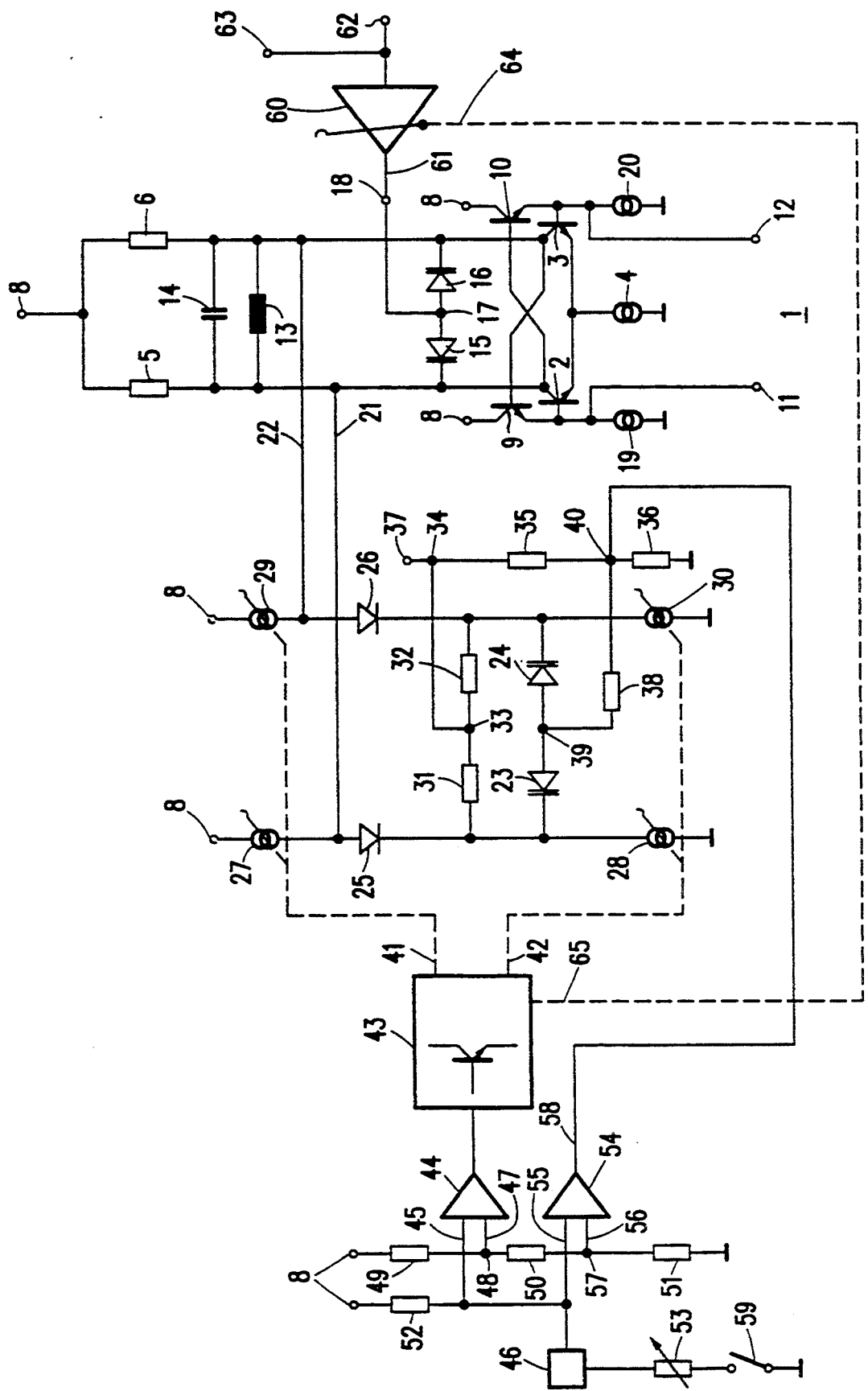

OSCILLATOR WITH SWITCHABLE VARACTOR DIODES

BACKGROUND OF THE INVENTION

1. Field of the Invention

The invention relates to an oscillator having first frequency-determining elements provided for a first oscillation frequency.

2. Description of the Related Art

For mixing and demodulating video signals, oscillators are required to generate oscillations at different frequencies. If only a video signal having a given transmission standard is to be processed, oscillators having fixed oscillation frequencies can be used for this purpose. However, if a circuit arrangement is to be suitable for processing video signals of different transmission standards, a large number of different oscillators would be required for processing signals at the different frequencies then occurring. Such a circuit construction is, however, very elaborate and consequently uneconomical and also difficult to manufacture and adjust.

SUMMARY OF THE INVENTION

It is therefore an object of the invention to provide an oscillator particularly for use in video signal processing, which oscillator is switchable and tunable to at least two oscillation frequencies.

In an oscillator of the type described in the opening paragraph, this object is achieved by at least a second frequency-determining element which can be connected to the first frequency-determining element for adjusting the oscillator to a second oscillation frequency.

The invention does not only lead to a large reduction of the number of components as compared with two separately constructed oscillators, but the conditions are also created for transmitting, processing and converting, for example, a multitude of video signals in accordance with different transmission standards by means of a single signal processing arrangement which can be switched or adjusted, as required. Consequently, a maximum number of components of the overall arrangement is used for a maximum number of different possibilities so that, overall, a simpler construction is obtained. Moreover, at least substantially equal transmission conditions for all video signals to be processed are created without any further additions. The oscillator according to the invention is particularly also suitable as a switchable, voltage-controlled oscillator for use in phase-locked loops which are optionally adjustable at the particularly French transmission standards SECAM L and SECAM L' (VHF band I). With such a switchable oscillator, a switchable intermediate frequency oscillation can be generated in a simple way, for example, a picture carrier oscillation of 38.9 MHz for the "L standard" and a picture carrier oscillation of 33.9 MHz for the "L' standard". The switchable oscillator according to the invention has the advantage that a narrow lock-in range can be set for a phase-locked loop incorporating this oscillator so as to avoid lock-in on a neighboring channel or a sound carrier oscillation, while the phase-locked loop can still be used in a further frequency range.

In a further embodiment of the invention the first frequency-determining element preferably comprises a first capacitance which can be connected in parallel with a second capacitance as the second frequency-determining element. Such an arrangement can be realized with simple constructive means.

The second frequency-determining element(s) can advantageously be connected via at least a switching diode. Such a switching diode has a simple structure and can also be used for high oscillation frequencies. It can be switched with simple means, preferably a direct current, between a conducting and a blocked state and can be integrated on a semiconductor body, preferably together with the oscillator components.

In a further embodiment of the oscillator according to the invention, a supply circuit is provided which comprises at least a controllable current source by which the switching diode is fed and which is optionally switchable between the conducting or the blocked state. Such a supply circuit can also be combined with the elements of the oscillator and the switching diode in an easy and compact way. The controllable current source(s) can then be preferably controlled by a (first) driver stage which is incorporated in the supply circuit. Advantageously, this (first) driver stage comprises a switching transistor through which the controllable current source(s) can be switched between two predetermined current values. Consequently, the second frequency-determining element can also be easily and reliably connected to or disconnected from a logic circuit having logic signal levels.

Advantageously, the supply circuit of the type described hereinbefore also comprises a device for tuning the second frequency-determining element. The supply circuit does not only connect the second frequency-determining element optionally, but it is also tuned to the correct oscillation frequency of the oscillator. In a simple and reliable structure, the second frequency-determining element in a further embodiment of the oscillator according to the invention comprises at least a capacitance diode and the device for tuning the second frequency-determining element comprises a second driver stage for generating a bias voltage for this capacitance diode.

Advantageously, the afore-mentioned driver stages incorporated in the supply circuit comprise a differential amplifier each. Both differential amplifiers are controlled by a common control signal at one of their respective inputs. Threshold values of different levels are applied to the second inputs of the differential amplifiers, which values are preferably derived as reference voltages from a common resistive voltage divider or from a corresponding reference voltage source. These threshold values are dimensioned in such a way that the threshold value applied to the first driver stage limits a control range of the second driver stage fixed by the threshold value applied to the second driver stage. In this way it is possible to use the common control signal not only for optionally connecting or disconnecting the second frequency-determining element but also to tune its value within a predetermined range. If desired, this tuning range is fixed precisely by the choice of the threshold values.

These and other aspects of the invention will be apparent from and elucidated with reference to the embodiments described hereinafter.

BRIEF DESCRIPTION OF THE DRAWING

In the drawing the sole Figure shows the circuit diagram of an embodiment according to the invention.

DESCRIPTION OF THE PREFERRED EMBODIMENT

In the Figure, an oscillator 1 comprises a differential amplifier stage consisting of two transistors 2, 3 whose emitters are jointly connected to ground via a current source 4. The collectors of the transistors 2, 3 are connected to a power supply terminal 8 via collector resistors 5, 6, respectively. Each collector of the transistors 2, 3 is connected to the base of an emitter-follower transistor 9, 10, respectively, whose collectors are connected to power terminal 8 and whose emitters are connected to output terminals 11, 12. A connection with the base of one of the transistors 2, 3 of the differential amplifier stage is realized for each emitter-follower transistor 9, 10 via its emitter, so that the collector of one of the transistors 2, 3 is coupled to the base of the respective other transistor 3, 2 of the differential amplifier stage via each of the emitter-follower transistors 9, 10. In this way a positive feedback is obtained. The first frequency-determining elements for a first oscillation frequency are connected between the collectors of the transistors 2, 3 of the differential amplifier stage and comprise an inductance 13, a capacitance 14 and a tunable element in the form of two series-opposed capacitance diodes 15, 16 whose junction point 17 is connected to a reference voltage terminal 18 via which a reverse bias voltage can be impressed on the capacitance diodes 15, 16. The oscillator 1 can then be adjusted to the first oscillation frequency via the reference voltage terminal 18.

To feed the emitter-follower transistors 9, 10, their emitters are connected to current sources 19 and 20, respectively, which are connected to ground.

The oscillator 1 can also be operated as a voltage-controlled oscillator via the reference voltage terminal 18, for example when it is used in a phase-locked loop.

To switch the oscillator 1 to a second oscillation frequency, second frequency-determining elements comprising two series-opposed capacitance diodes 23, 24 are arranged in parallel with the first frequency-determining elements 13 to 16 via connections 21, 22. The second frequency-determining elements 23, 24 are connected to the connections 21 and 22 via switching dimes 25, 26, respectively. Two controllable current sources 27, 28 and 29, 30 are arranged between the power supply terminal 8 and ground, in series with each of the switching diodes 25, 26. This is realized in such a way that one of the current sources is connected by means of one of its terminals to one of the junction points between the connection 21 and the first switching diode 25, between the connection 22 and the second switching diode 26, between the first switching diode 25 and the first capacitance diode 23 of the second frequency-determining element and between the second switching diode 26 and the second capacitance diode 24 of the second frequency-determining element, while a further terminal of the current sources 27 to 30 is connected either to the power supply terminal 8 or to ground. Thus, the first switching diode 25 is fed by the controllable current sources 27 and 28 and the second switching diode 26 is fed by the controllable current sources 29 and 30. By switch-over, switch-on and switch-off of the controllable current sources 27 to 30, either a direct current can be impressed on the switching diodes 25, 26, by which current they are rendered conducting, or the controllable current sources 27 to 30 can be rendered currentless so that also the switching diodes 25, 26 are blocked. In the first-mentioned case the second frequency-determining elements 23, 24 are arranged parallel to the first frequency-determining elements 13 to 16, in the second case, this connection is interrupted and the oscillator 1 operates at the first oscillation frequency.

A series arrangement of two resistors 31, 32 is arranged parallel to the series arrangement of the capacitance diodes 23, 24 and the j unction point 33 of these resistors is connected to a first tap 34 of a resistive voltage divider comprising two resistors 35 and 36 which are arranged between a further reference voltage terminal 37 and ground. A further resistor 38 is connected to the junction point 39 between the capacitance diodes 23 and 24 and to a second tap 40 of the resistive voltage divider 35, 36 which is constituted by the junction point of the two resistors 35 and 36. The capacitance diodes 23, 24 are reverse-biased via the resistive voltage divider 35, 36 as well as the resistors 31, 32, 38, while the circuit arrangement is dimensioned in such a way that the switching diodes 25, 26 are reliably blocked when the current sources 27 to 30 are switched off.

Advantageously, the controllable current sources 27 to 30 are interconnected in a common current mirror configuration. To this end, each of the controllable current sources 27 to 30 comprises at least a current source transistor and the control terminals of these current source transistors are pair-wise combined in accordance with the operating connections 41 and 42 shown in broken lines in the Figure. Particularly, the current sources 27, 29 connected to the power supply terminal 8 and the current sources 28, 30 connected to ground are controlled in common by the operating connections 41 and 42, respectively, preferably by way of a direct connection of the control terminals of the current source transistors present in these current sources. A current control circuit 43 preferably comprises a current mirror which commonly controls the operating connections 41 and 42. The input branch or primary branch of this current mirror in the current control circuit 43 can be switched off or bridged via a switching transistor so that it can optionally be rendered currentless and, consequently, also the controllable current sources 27 to 30 can be rendered currentless via the operating connections 41, 42. This switching transistor is symbolically shown within the circuit block representing the current control circuit 43.

The current control circuit 43 is controlled by a first driver stage 44 of which essentially the switching transistor within the current control circuit 43 is activated. The first driver stage 44 particularly comprises a differential amplifier whose first input 45 is connected to a control signal terminal 46 and whose second input 47 is connected to a first tap 48 of a second resistive voltage divider comprising three resistors 49, 50, 51 arranged between the power supply terminal 8 and ground. A threshold value is made available by the second resistive voltage divider 49, 50, 51 at its first tap 48, at which value the control signal at the control signal terminal 46 switches the controllable current sources 27 to 30 and hence connects or disconnects the second frequency-determining element 23, 24 when this control signal exceeds or falls below the threshold value. In the Figure, the control signal is made available at the control signal terminal 46 via a further voltage divider consisting of a resistor 52 connected by the control signal terminal 46 to the power supply terminal 8 and a variable resistor 53 connected by the control signal terminal 46 to ground. The connection between the resistor 53 and ground may preferably be interruptible by means of a switching device 59. In particular, the overall circuit arrangement described so far may be integrated on a semiconductor body and the control signal terminal 46 may preferably be an external terminal of the integrated circuit arrangement thus formed. The variable resistor 53 may then be constituted, for example by a control transistor or a potentiometer.

However, in the circuit arrangement according to the invention, the second frequency-determining elements are also tuned to the desired second oscillation frequency of the oscillator 1 when these elements are connected or disconnected via the control signal terminal 46. To this end, a second driver stage 54 is provided, whose first input 55 is also connected to the control signal terminal 46 and whose second input 56 is connected to a second tap 57 of the second resistive voltage divider 49 to 51. The output 58 of this second driver stage 54 is connected to the second tap 40 of the resistive voltage divider 35, 36.

As compared with the threshold value taken from the first tap 48 for the first driver stage 44, the threshold value given for the second driver stage 54 by the voltage at the second tap 57 is dimensioned in such a way that the threshold value at the first driver stage 44 limits a control range of the second driver stage 54, which range is fixed by the threshold value at this second driver stage 54. The second driver stage 54 preferably also comprises a differential amplifier, and the control range of the voltage between the inputs 55 and 56, within which range this voltage is in a linear relationship with a signal thus produced at the output 58, is brought to such a level by choosing the threshold value at the second tap 57 that the control signal at the control signal terminal 46 reaches the threshold value at the first input 45 of the first driver stage 44 and thus disconnects the second frequency-determining elements 23, 24 when a limit (preferably the upper limit) of this control range is reached. Within said control range, an adjusting voltage for varying the capacitances of the capacitance diodes 23, 24 is superimposed at the second tap 40 on the bias voltage of the second frequency-determining elements 23. 24 by the second driver stage 54. In the embodiment shown in the Figure, the second resistive voltage divider 49 to 51, the further voltage divider 52, 53, the collector resistors 5, 6, the current sources 27 and 29 and the collectors of the emitter-follower transistors 9, 10 are connected to the same power supply terminal 8 for the sake of simplicity. Dependent on the potentials required, several power supply terminals may be provided for this purpose.

In an example of dimensioning the oscillator according to the invention for switching between the French video signal transmission standards L and L', the first oscillation frequency is twice as large as the picture carrier frequency of 38.9 MHz for the transmission standard L and the second oscillation frequency is twice as large as the picture carrier frequency of 33.9 MHz for the transmission standard L'. The second frequency-determining elements 23, 24 are connected by closing the switching device 59 when the oscillator is set at the transmission standard L'. A setting range of approximately 1.2 MHz can be achieved for the oscillator 1 with the connected second frequency-determining element via the variable resistor 53, the second driver stage 54 and the variation of the capacitances of the capacitance diodes 23, 24. Moreover, the oscillator according to the invention has a low variation of the oscillation frequency when it is above the operating temperature.

When adjusting an oscillator, as described hereinbefore, via the reference voltage terminal 18, it appears that the slope of the adjusting characteristic, i.e. the dependence of the oscillation frequency variation on the variation of the reverse bias voltage at the reference voltage terminal 18 is changed upon setting to the various oscillation frequencies. This variation of the slope is based on the different values of the frequency-determining elements, preferably of the capacitance diodes for the different oscillation frequencies. Particularly when the described oscillator is used in a phase-locked loop, the different slopes have their effect on a variation of the control behavior of the control loop between the different oscillation frequencies.

This phenomenon can be obviated by an amplifier element 60 whose gain factor, jointly with the connection of at least one of the second frequency-determining elements 23, 24, is switchable. An adjusting signal, from which the reverse bias voltage results with said gain factor at the reference voltage terminal 18, is applied to the reference voltage terminal 18 via this amplifier element 60. The gain factor of the amplifier element 60 is preferably chosen with respect to each oscillation frequency in such a way that adjusting characteristics having at least substantially corresponding slopes result for the adjustment of the oscillator 1 to all adjustable oscillation frequencies by the adjusting signal. Thus, the "transmission ratios" deviating due to the different slopes between an applied adjusting signal and a variation of the oscillation frequency are corrected by the different gain factors so that, overall, there are always substantially at least equal characteristics between the adjusting signal, on the one hand, and the variations of the oscillation frequencies on the other hand. A phase-locked loop incorporating the oscillator 1 then has an identical control behavior at all adjustable oscillation frequencies.

In the embodiment shown in the Figure the output 61 of the amplifier element 60 is connected to the reference voltage terminal 18. An input 62 of the amplifier element 60 receives the adjusting signal. The input 62 is also connected to a terminal 63 via which this adjusting signal can be applied as an AFC voltage to other signal processing stages. The gain factor of the amplifier element 60 is adjusted to the desired value via a switching input 64. To this end, the switching input 64 is connected to an output 65 of the current control circuit 43 which has a function equivalent to that of the operating connections 41, 42. The controllable current sources 27 to 30 and the amplifier element 60 are then simultaneously controlled or switched over by the current control circuit 43.

In a modification of this embodiment, the input 62 of the amplifier element 60 may be connected to the reference voltage terminal 18 and its output 61 may be connected to the terminal 63. The adjusting signal is then directly applied as a reverse bias voltage to the capacitance diodes 15, 16 from the reference voltage terminal 18 and applied to the input 62 of the amplifier element 60. After an amplification which is predetermined by the switchable gain factor, which amplification again compensates the different slopes of the characteristics between the reverse bias voltage and the oscillation frequency, the adjusting signal reaches the terminal 63 as an AFC signal.

We claim:

1. An oscillator having first frequency-determining elements for providing a first oscillation frequency, characterized in that said oscillator further comprises second frequency-determining elements connectable to the first frequency-determining elements for adjusting the oscillator to a second oscillation frequency; and an amplifier element having a gain factor which is switchable, jointly with the connection of at least one of the second frequency-determining elements, said amplifier element providing an adjusting signal applicable to the first frequency-determining elements.

2. An oscillator as claimed in claim 1, characterized in that the first frequency-determining elements comprise a first capacitance, and the second frequency-determining elements comprise a second capacitance, wherein said second capacitance is connectable in parallel with said first capacitance.

3. An oscillator as claimed in claim 1, characterized in that the second frequency-determining elements are connectable to the first frequency-determining elements via at least a switching diode.

4. An oscillator as claimed in claim 3, characterized in that said oscillator further comprises a supply circuit which comprises at least a controllable current source, said supply circuit being coupled to the switching diode for optionally switching the switching diode between a conducting state and a blocked state.

5. An oscillator as claimed in claim 4, characterized in that the supply circuit comprises a first driver stage for controlling the controllable current source.

6. An oscillator as claimed in claim 4, characterized in that the supply circuit comprises a device for tuning the second frequency-determining elements.

7. An oscillator as claimed in claim 6, characterized in that the second frequency-determining elements comprise a capacitance diode and the device for tuning the second frequency-determining elements comprise a second driver stage for generating a bias voltage for this capacitance diode.

8. An oscillator as claimed in claim 7, wherein said supply circuit comprises a first driver stage for controlling the controllable current source, characterized in that the first and second driver stages each comprise a differential amplifier having a first and a second input, the differential amplifiers being controlled by a common control signal at the respective first inputs, and the respective second inputs receive respective threshold values of different levels which are dimensioned in such a way that the threshold value applied to the first driver stage limits a control range of the second driver stage fixed by the threshold value applied to the second driver stage.

9. An oscillator as claimed in claim 1, characterized in that the gain factor for each of the oscillation frequencies is chosen to be such that adjusting characteristics having at least substantially corresponding slopes result for the adjustment of the oscillator to all adjustable oscillation frequencies by the adjusting signal.

10. An oscillator having a first frequency-determining elements for providing a first oscillation frequency, characterized in that said oscillator further comprises:
    second frequency-determining elements connectable to the first frequency-determining elements for adjusting the oscillator to a second oscillation frequency, said second frequency-determining elements comprise a capacitance diode;
    a device for tuning the second frequency-determining element, said device comprising a first driver stage for generating a bias voltage for the capacitance diode of the second frequency-determining elements;
    a switching diode for connecting the second frequency-determining elements to the first frequency-determining elements; and
    a supply circuit coupled to said switching diode for optionally switching said switching diode between a conducting state and a blocked state, said supply circuit comprises a controllable current source and a second driver stage for controlling the controllable current source, wherein the first and second driver stages each comprise a differential amplifier having a first and a second input, the differential amplifiers being controlled by a common control signal at the respective first inputs, and the respective second inputs receive respective threshold values of different levels which are dimensioned in such a way that the threshold value applied to the second driver stage limits a control range of the first driver stage fixed by the threshold value applied to the first driver stage.

* * * * *